United States Patent [19]

Agatsuma

[11] Patent Number: 4,657,630
[45] Date of Patent: Apr. 14, 1987

[54] METHOD FOR MANUFACTURING SEMICONDUCTOR DEVICE HAVING ISOLATING GROOVE

[75] Inventor: Takashi Agatsuma, Kodaira, Japan

[73] Assignee: Hitachi, Ltd., Tokyo, Japan

[21] Appl. No.: 573,322

[22] Filed: Jan. 24, 1984

[30] Foreign Application Priority Data

Jan. 31, 1983 [JP] Japan .................. 58-12744

[51] Int. Cl.$^4$ .............. H01L 21/306; B44C 1/22; C03C 15/00; C03C 25/06
[52] U.S. Cl. .......................... 156/643; 29/571; 29/576 W; 29/580; 148/187; 156/646; 156/648; 156/649; 156/651; 156/653; 156/657; 156/661.1; 156/662; 357/49
[58] Field of Search .......... 156/643, 646, 648, 649, 156/651, 653, 657, 659.1, 661.1, 662; 29/571, 576 W, 576 B, 580; 148/1.5, 187; 357/49; 427/93

[56] References Cited

U.S. PATENT DOCUMENTS

| | | | |
|---|---|---|---|
| 4,433,470 | 2/1984 | Kameyama et al. | 156/649 X |
| 4,445,967 | 5/1984 | Kameyama | 156/657 X |

FOREIGN PATENT DOCUMENTS

2626738 1/1977 Fed. Rep. of Germany .
3108377 2/1982 Fed. Rep. of Germany .

OTHER PUBLICATIONS

Chiu et al., "A Bird's Beak Free Local Oxidation Technology Feasible for VLSI Circuits Fabrication", in *IEEE Journal of Solid-State Circuits*, vol. SC-17, No. 2 (Apr. 1982), pp. 166–170.

*Primary Examiner*—William A. Powell
*Attorney, Agent, or Firm*—Antonelli, Terry & Wands

[57] ABSTRACT

A semiconductor device having a LOCOS region formed on a Si substrate comprises a minute groove filled with non-oxidizable isolation film provided at the boundary between the LOCOS region and an IC area to be formed on the Si substrate. The non-oxidizable isolation film prevents the intrusion of thermal oxidation for the LOCOS region into the IC region, and is of silicon nitride 1000–10000 Å width.

A method of manufacturing a semiconductor device having a LOCOS region formed on a Si substrate comprises the steps of depositing a silicon nitride film on the substrate; etching a minute width region at the boundary between an area to be the LOCOS region and an area to be an IC region on the substrate by anisotropic etching with a reactive ion etching mode, thereby to form a groove thereat thermal-oxidizing the Si substrate to form a thin $SiO_2$ film on an area to be covered with silicon nitride; filling the groove with silicon nitride; thermal-oxidizing a part of the Si substrate other than the area covered with silicon nitride films formed previously; and removing the silicon nitride film deposited at the first step to flatten the surface of the Si substrate.

24 Claims, 14 Drawing Figures

METHOD FOR MANUFACTURING SEMICONDUCTOR DEVICE HAVING ISOLATING GROOVE

BACKGROUND OF THE INVENTION

This invention relates to a semiconductor device and a manufacturing method thereof; and more particularly to the formation of an isolation structure which is employed for isolating active devices from each other in a MOS type VLSI circuit on a Si substrate, and gives a suitable method for manufacturing a fine pattern and large scale integrated device.

In the process of fabricating an LOCOS film (region) in a MOS type VLSI circuit, a double layer consisting of a $SiO_2$ film and a silicon nitride film which are formed on a Si substrate is used. And the silicon nitride film on an area to be oxidized for isolation is etched away. The exposed area is subjected to heat treatments in an oxidation atmosphere to form an LOCOS film. Thereafter, such bird's beak of LOCOS film as to intrude beneath the silicon nitride film are formed at the edge of the $SiO_2$ film. The width of bird's beak region amounts to an under value of 0.9–1.0 μm, which greatly limits the degree of the integration of circuits.

As an attempt to overcome such a problem as mentioned above, a SWAMI (Side Wall Masked Isolation) process has been proposed. In this process, a $Si_3N_4$ film 1 is not only provided on an active area but an $Si_3N_4$ film 2 is provided on the side wall thereof in order to prevent the oxidation from proceeding in a transverse direction toward the active area as shown in FIG. 1a. This process is explained in an article entitled "A Bird's Beak Local Oxidation Technology Feasible for VLSI Circuits Fabrication" by K. Y. Chiu et al. in IEEE Journal of Solid-State Circuits, Vol. SC-17, No. 2 April, pp. 166, 1982.

However, as shown in FIG. 1b, such a structure entails the intrusion of the bird's beak, $SiO_2$ region 3 beneath the silicon nitride film 2, when Si substrate 4 is oxidized to form the $SiO_2$ region 3 at the area to be a LOCOS region by heat treatment and results in a leakage LOCOS isolation due to the generation of crystal defects at Si-$SiO_2$ interface of LOCOS edge, and furthermore, a fragile bird's head is formed, showing concave shape around the edge of the LOCOS surface; hence, requires a part of the $SiO_2$ region on the Si substrate surface to be eliminated and flatly ground after the LOCOS region is formed, for an optimum use of the $Si_3N_4$ films in subsequent steps.

SUMMARY OF THE INVENTION

Accordingly, it is an object to provide a semiconductor device or a VLSI device with a line width of submicron dimensions which permits a flat and a elaborate LOCOS region with little occurrence of abnormal regions to be obtained with high productivity and can be obtained with high productivity and can be useful in high-degree integrated circuits; and a method of manufacturing such a device.

In order to attain such an object, in accordance with the present invention, a minute groove is formed at the periphery of an active region, adjacent to the LOCOS region, and filled with a silicon nitride film.

Other and further objects, features and advantages of the invention will become more apparent from the following description taken in conjunction with the accompanying drawings.

DESCRIPTION OF THE PREFERRED EMBODIMENT

Figure 1A:
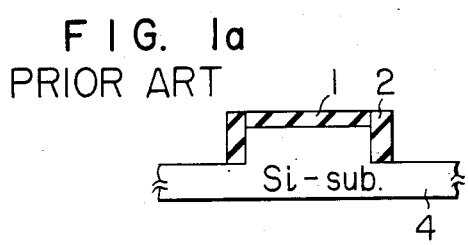
FIGS. 1a and 1b are sectional views showing the manner by which an abnormal region is formed on an oxide film in the conventional semiconductor device.
Figure 1B:
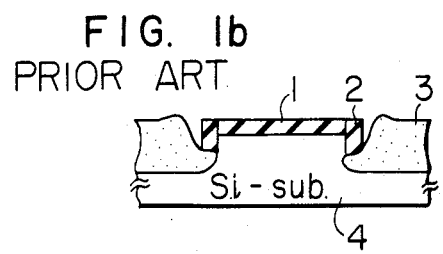

Referring now to the drawing, an explanation will be made on the embodiment of this invention.

First, a P-type Si substrate 10 having resistivity of about 10 Ω.cm is prepared to form a dynamic RAM. At the step of FIG. 2a, a triple structure film consisting of a first $SiO_2$ film 11, a first silicon nitride film 12, and a second $SiO_2$ film 13 is formed on the Si substrate 10.

The first $SiO_2$ 11 serves to relax a stress which may occur between the first silicon nitride film 12 and the Si substrate 10, therefore being indispensable to a common LOCOS region. The first $SiO_2$ film 11 is formed with the thickness of 100–1000 Å (more preferably 100–200 Å by thermal oxidation in wet $O_2$ atmosphere at the temperature of 800°–1100° C. (more preferably about 1000° C.).

The first silicon nitride film 12 is formed with the thickness of 1000–10000 Å (for example 4000 Å) by plasma (LP) CVD method (Plasma Low Pressure Chemical Vapor Deposition Method) with the conditions of 20–40 Pa and 200°–300° C. through a chemical reaction: $3SiH_4 + 4NH_3 \rightarrow Si_3N_4 + 12H_2$.

Where a thin silicon nitride film is desired, it may be formed by a method of thermal decomposition at the temperature between 600°–800° C.

This film has a strength against a higher temperature, though it entails a stress at the interfaces to the $SiO_2$ films 11 and 13. The normal composition of silicon nitride is $Si_3N_4$ as indicated in the above reaction formula but the actually obtained composition may be displaced from the normal composition, i.e., Si/N atom ratio may be 0.7–1.1.

The silicon nitride blocks oxygen from diffusing into it, indicating that it is not oxidized in the oxidizing atmosphere at high temperature, whereas thermally oxidizing silicon changes into silicon dioxide. The silicon nitride film 12 can contain silicon oxynitride composition ($S_xO_yN_z$) due to the presence of the $SiO_2$ films 11, 13 adjacent to it. These facts, however, don't give any adverse effects in this embodiment according to the invention.

The second $SiO_2$ film 13 of 1000–10000 Å, for example 3000 Å thickness, is formed on the first silicon nitride film by LPCVD method with the conditions of 20–80 Pa and 600°–800° C. in tetraethylorthsilane Si-$(OC_2H_5)_4$ gas atmosphere. Plasma LPCVD method accompanied by plasma discharge can also be used for this purpose. The second $SiO_2$ film 13 acts as a mask for preventing the silicon nitride film 12 from being etched, at the step of etching the groove provided on the side wall of the Si substrate 10, this step will be described later.

Figure 2A:
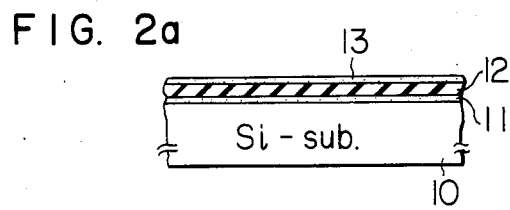
FIGS. 2a to 2l are flow diagrams which show an example of a semiconductor device according to this invention and a manufacturing process thereof.
Figure 2G:
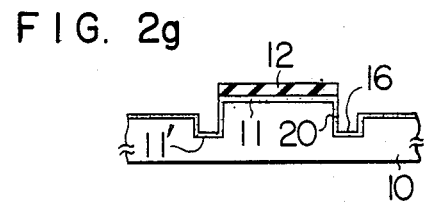
Figure 2B:
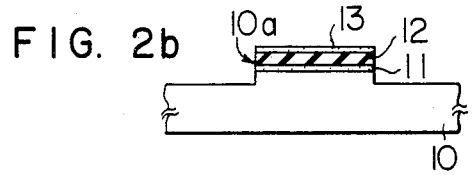

At the photoresist step illustrated in FIG. 2b, a posiresist (positive photoresist) of 2–3 μm thickness such as OFPR 800 and its derivatives is applied on the resultant surface of the wafer in FIG. 2a, which thereafter, is exposed and developed with a mask pattern using a projection aligner having magnification ratio of 1:1 or a reduction projection aligner having reduction ratio of 1:5 or 1:10. The $SiO_2$ films 11 and 13 are plasma-etched in a gas atmosphere containing at least one of $CHF_3$ and $C_2F_6$, and the silicon nitride film 12 is plasma-etched in the $CF_4+O_2$ gas at about 40 Pa using the mask. These three etchings are carried out concurrently. The thickness of the posi-resist is determined according to the condition of the plasma etching. Next, the Si substrate 10 is etched by the depth of about 4000 Å under the reactive ion etching condition at 10 Pa or less in $CCl_4$ and/or $SF_6$ gas, using the $SiO_2$ film 13 as a mask because the $SiO_2$ film is not etched by the gases. The ratio of the etching speed of the $SiO_2$ film or silicon nitride by ($CF_4+O_2$) gas to that of the posi-resist thereby—this ratio is called selective ratio—is significant at this step since the thickness of the posi-resist is determined depending on this selection ratio. At this step (10a) the posi-resist of about 4000 Å height, is formed, and thereafter the posi-resist is plasma-etched away in $O_2$ gas, washed in ozon sulphuric solution, and further washed in water until its complete removal.

Figure 2H:
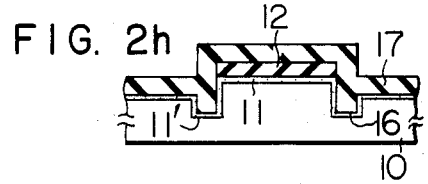
Figure 2C:
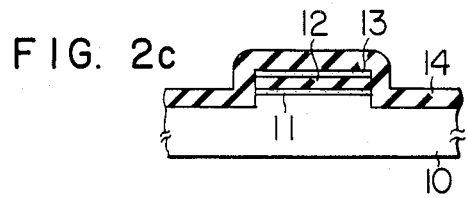

At the step of FIG. 2c, a second silicon nitride film 14, 1000–10000 Å (more preferably 4000–7000 Å) thick, is deposited on the entire surface of the Si substrate 10 using plasma LP CVD method with the conditions of 200°–300° C. and 20–40 Pa.

Figure 2I:
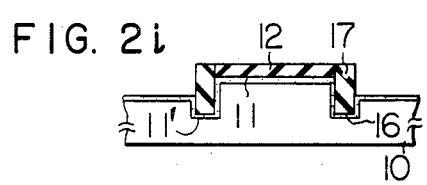
Figure 2D:
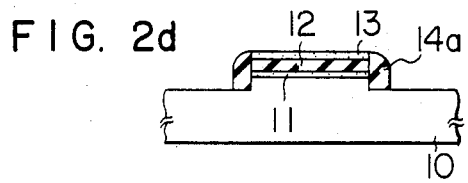

At the step of FIG. 2d, the silicon nitride film 14 undergoes an anisotropic etching with RIE mode in the vertical direction at about 20 Pa in (90% $CF_4$+10% $O_2$) gas so as to leave only a side wall 14a of the silicon nitride film 14 deposited on the side surface formed at the step of FIG. 2b. Thus, the surface of the Si substrate 10 is exposed at the outer peripheral area of this film 14a. The width of this film 14a in the horizontal direction is substantially equal to the thickness of the silicon nitride film 14 deposited at the step of FIG. 2c.

Figure 2J:
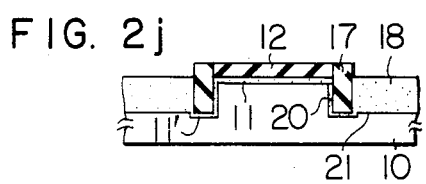
Figure 2E:
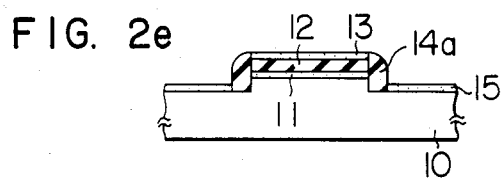

At the step of FIG. 2e, the exposed surface of the Si substrate 10 is subjected to thermal oxidation at the temperature of 800°–1100° C. thereby forming a $SiO_2$ film 15, 1000–3000 Å.

Figure 2K:
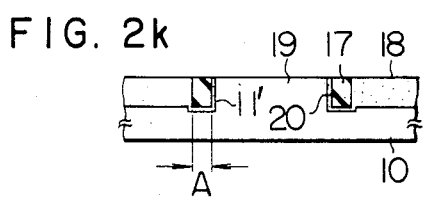
Figure 2F:
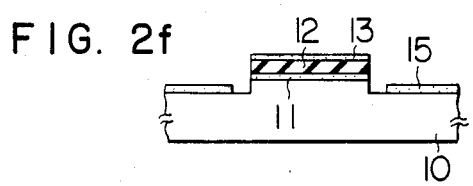

At the step of FIG. 2f, the Si substrate 10 is dipped in 20–50% hot phosphoric acid solution ($H_3PO_4$) of 80°–110° C. to etch away the silicon nitride film 14a. Then, the $SiO_2$ films 13, 15 and the Si substrate 10 are not etched.

At the step of FIG. 2g, exposed silicon of the Si substrate 10 is anisotropically etched in the vertical direction under the RIE condition at 10 Pa or less in $CCl_4$ or $SF_6$ gas, using the $SiO_2$ films 13, 15 as a self-aligned mask. Thus, a groove 16 about 4000 Å depth is formed along the side wall 20 of silicon.

The selective etching ratio of $Si/SiO_2$ is a critical factor in the same sense as described above. The width of this groove is substantially equal to that (2000–6000 Å) of the second silicon nitride film 14. Thereafter, $SiO_2$ films 13, 15 are etched away simultaneously by dipping the wafer into hydrofloric acid solution (HF). The silicon 10 and the silicon nitride film 12 are not etched.

Surfaces of silicon of the substrate 10 are thermally oxidized to form $SiO_2$ films 11' having a thickness of 100–200 Å.

At the step of FIG. 2h, a third silicon nitride film 17, 2000–6000 Å thick is deposited using plasma LP CVD method on the entire surface of the substrate 10. Assuming that the width of the groove 16 is 4000 Å, this groove is filled with silicon nitride when the latter is deposited by the thickness of 2000 Å. More than 500 Å of the thickness of the film 17 is necessary to fill the groove 16 of a width of 1000 Å.

At the step of FIG. 2i, the silicon nitride film 17 is etched under the condition of RIE mode at 20 Pa in (90% $CF_4$+10% $O_2$) gas. This etching is stopped at the boundary between the silicon nitride films 12 and 17. Silicon region around the island is exposed. Thus, the silicon nitride filled in the groove 16 is formed thereby to connect with the silicon nitride film 12 formed at the step of 2b.

At the step of FIG. 2j, the parts of the Si substrate other than the regions covered with silicon nitride films 12 and 17 are subjected to thermal oxidation in wet $O_2$ ambient at the temperature of 800°–1100° C. The atmosphere for this wet oxidation may be provided by the combustion of the mixed gas having the content 1.8 ($H_2$)+1.0 ($O_2$). If the temperature for this oxidation is lower than 1000° C., more preferably lower than 950° C., the stress at the interface to the silicon nitride will be reduced. The oxidation under the low temperature can be accelerated under a higher pressure of 4 to 5 atmosphere. Thus, a $SiO_2$ film 18 about 8000 Å thick is formed. It contact to the substantially perpendicular film of the silicon nitride film 17. It should be noted that oxidized Si swells twice as much as the original one and the bottom surface 21 of the $SiO_2$ film is substantially at most the same level as the bottom of the groove 16. Thus, the $SiO_2$ film 18 invades down to the depth of about 4000 Å of the groove 16 while it swells up to the height of about 4000 Å of the stage 10a.

On the other hand, the intrusion of the oxidized Si into the part to be a MOS type active area encircled by the third silicon nitride film (side wall) 17 is restrained so that any bird beak or bird head described about may not occur. Namely, the presence of the silicon nitride film 17 on the entire region to be oxidized fully restrains the oxidization toward the active area (IC area).

At the co-planar formation step of FIG. 2k, the upper surfaces of the silicon nitride film 12 and the silicon nitride 17 are etched away at the etching rate as slow as 100 to 600 Å/min in hot $H_3PO_4$ aqueous solution at temperature of 50° to 80° C. to the level of the top surface of the $SiO_2$ film 11, and the $SiO_2$ film 11 is etched away in buffered HF such as ($1NH_4F+6H_2O$) solution. In another way, instead of the wet etching, these silicon nitride films and the $SiO_2$ films can be etched away by dry etching such as plasma etching, or ground away by using diamond paste containing powdered grains of 0.1–0.2 $\mu$m in diameter, with a lubricant. Thus, as shown in FIG. 2k, the processes in accordance with the present invention allow the isolation film having a bird beak area A with the reduced width of 0.3 $\mu$m or less, or a LOCOS to be formed.

Figure 2L:
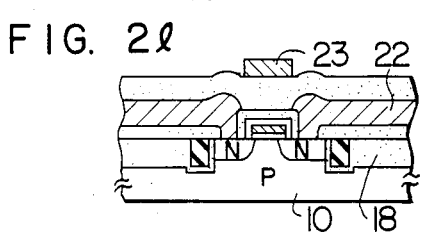

In the final step as shown in FIG. 2l, microcircuits are made in the islands 19 and multilayer interconnections 22 and 23 are formed over the flattened co-planar surfaces. In this process, a non-oxidizable isolation film such as refractory metal nitride of tantalum nitride, Molybdenum nitride and Tungsten nitride may be also employed instead of the third silicon nitride.

While the invention has been particularly shown and described with the preferred embodiment thereof, it will be understood by those skilled in the art that the foregoing and other changes in form and details can be made therein without departing from the spirit and scope of the invention.

I claim:

1. A method for manufacturing a semiconductor device comprising a semiconductor substrate, at the principal surface of which semiconductor substrate a groove is provided, comprising the steps of:
    (a) forming a step at said principal surface;
    (b) selectively forming a first mask at the side wall of said step;
    (c) selectively forming a second mask at said principal surface using said first mask as a mask; and
    (d) selectively removing said first mask to selectively expose said principal surface.

2. A method for manufacturing a semiconductor device according to claim 1, wherein said first mask is selectively formed such that it only is formed at the side wall of said step.

3. A method for manufacturing a semiconductor device according to claim 1, wherein said first mask forming step comprises a step of forming a layer of the material of the first mask on the principal surface and directionally etching the layer to leave only those portions located on said side wall and to expose the surface of the semiconductor substrate.

4. A method for manufacturing a semiconductor device according to claim 3, wherein the material of the first mask is silicon nitride.

5. A method for manufacturing a semiconductor device according to claim 3, wherein the directional etching is performed by reactive ion etching.

6. A method for manufacturing a semiconductor device according to claim 5, wherein the material of the first mask is silicon nitride.

7. A method for manufacturing a semiconductor device according to claim 1, further comprising a step of selectively forming a groove at the exposed principal surface.

8. A method for manufacturing a semiconductor device according to claim 7, wherein the groove is selectively formed by reactive ion etching of the exposed principal surface.

9. A method for manufacturing a semiconductor device according to claim 7, comprising the further step of forming a layer of an insulating material so as to fill said groove.

10. A method for manufacturing a semiconductor device according to claim 9, wherein said insulating material is silicon nitride.

11. A method for manufacturing a semiconductor device comprising the steps of:
    (a) selectively forming a first film to selectively cover a surface portion of a material to be treated, said first film, as selectively formed, having a side portion;
    (b) selectively forming a second film at the side portion of said first film in a plane view;
    (c) selectively forming a third film on the surface portion of said material not covered with said first and second film;
    (d) selectively removing said second film to selectively expose the surface portion of said material; and
    (e) selectively treating the exposed surface portion of said material except for the surface portion covered with said first and third film.

12. A method for manufacturing a semiconductor device according to claim 11, wherein said second film is selectively formed only at the side portion of said first film.

13. A method for manufacturing a semiconductor device according to claim 11, wherein said material to be treated is a silicon material.

14. A method for manufacturing a semiconductor device according to claim 13, wherein said first film is a composite film comprising a silicon oxide layer adjacent the material to be treated and a silicon nitride layer on the silicon oxide layer.

15. A method for manufacturing a semiconductor device according to claim 14, wherein said second film is formed of silicon nitride.

16. A method for manufacturing a semiconductor device according to claim 11, wherein the selective treatment of the exposed surface portion of the material includes etching said exposed surface portion of said material to form grooves in said material extending from said exposed surface portion.

17. A method for manufacturing a semiconductor device according to claim 16, comprising the further steps of forming a layer of an insulating material so as to fill said groove; selectively forming a further layer of an insulating material on the material to be treated, said further layer being formed using said first film and said layer as a mask; and removing said first film so as to expose the material to be treated, and partially removing the layer of an insulating material and said further layer, in the thickness direction, so as to provide a coplanar surface of said layer of an insulating material, said further layer and the exposed surface of the material to be treated.

18. A method for manufacturing a semiconductor device according to claim 17, including the further step of forming semiconductor elements in the exposed portion of the material to be treated.

19. A method for manufacturing a semiconductor device according to claim 17, wherein the material of said layer is silicon nitride.

20. A method for manufacturing a semiconductor device according to claim 19, wherein the material of the further layer is $SiO_2$.

21. A method for manufacturing a semiconductor device according to claim 20, including the further step of forming semiconductor elements in the exposed portion of the material to be treated.

22. A method for manufacturing a semiconductor device according to claim 20, wherein the $SiO_2$ of the further layer is formed by thermal oxidation of the material to be treated.

23. A method for manufacturing a semiconductor device according to claim 22, wherein the material to be treated is silicon.

24. A method for manufacturing a semiconductor device according to claim 23, including the further step of forming semiconductor elements in the exposed portion of the material to be treated.

* * * * *